United States Patent

Parise

[11] Patent Number: 5,891,487
[45] Date of Patent: Apr. 6, 1999

[54] APPARATUS FOR MAKING A MULTI-PORTION MIXING ELEMENT

[76] Inventor: Ronald J. Parise, 101 Wendover Rd., Suffield, Conn. 06078

[21] Appl. No.: 932,577

[22] Filed: Sep. 19, 1997

Related U.S. Application Data

[60] Provisional application No. 60/046,027, May 9, 1997.
[51] Int. Cl.⁶ .................................................. B29C 47/12
[52] U.S. Cl. ........................ 425/319; 264/295; 264/339; 425/325; 425/465; 425/466
[58] Field of Search ..................................... 425/319, 325, 425/376.1, 465, 466; 264/295, 339

[56] References Cited

U.S. PATENT DOCUMENTS

| | | | |
|---|---|---|---|
| 2,456,304 | 12/1948 | Morin ....................................... | 425/319 |
| 4,181,486 | 1/1980 | Saito ........................................ | 425/465 |
| 4,395,210 | 7/1983 | Hama ....................................... | 425/319 |
| 4,867,667 | 9/1989 | Moriyama ................................ | 425/465 |

Primary Examiner—Patrick Ryan
Assistant Examiner—Joseph Leyson
Attorney, Agent, or Firm—Fishman, Dionne, Cantor & Colburn

[57] ABSTRACT

An apparatus for making a multi-portion mixing element for a static mixer is disclosed. The apparatus includes a base and a split die set having a first die and a second die in axial alignment which are rotatably mounted to the base. Each of the dies have an opening forming an extrusion pattern which mate with respect to the other. The dies are capable of rotating together so that the patterns are in an aligned position during rotation. The dies are also capable of rotating to a misaligned position. An extruder for extruding an extrudable material through the first and second dies is provided and a controller controls the rotational position of the dies during extrusion. The dies are rotated simultaneously during extrusion with the patterns aligned to form a mixing portion of the mixing element and are rotated to a misaligned position to create a space between the mixing portions. A microprocessor may be utilized to control the rotation of the first and second dies and to control the flow of the extrudable material.

11 Claims, 3 Drawing Sheets

APPARATUS FOR MAKING A MULTI-PORTION MIXING ELEMENT

CROSS-REFERENCE TO RELATED APPLICATION

This application claims the benefit of U.S. Provisional Application Serial No. 60/046,027 filed May 9, 1997.

BACKGROUND OF THE INVENTION

1. Field of the Invention

This invention relates to mixing devices. More particularly, this invention relates to a new and improved apparatus and method for making a multi-portion mixing element for a static mixer, a multi-portion mixing element for a static mixer, and a static mixer including a multi-portion mixing element.

2. Prior Art

Many polymerizable resins are used in multi-component dispensers where final mixing of the resin takes place in the disposable tip called a static mixer. One of the more common static mixer designs utilized today is the twisted ribbon or the two-paddle mixer. These stationary mixers rotate the fluid resin components 180°, then split each component in half. The fluid components go through a series of splits and blends until the desired mixing is achieved. The dual component, single fluid resin then exits the static mixer and is deposited as required. When use of the resin applicator is complete, the static mixer tip is disposed of and the multi-component dispenser can be used another day with a new mixing tip. Examples of such devices are found in U.S. Pat. No. 4,538,920 and U.S. Pat. No. 4,753,536.

Although the twisted ribbon mixer is quite reliable and inexpensive, it does have drawbacks. Resin components with large viscosity differences are difficult to blend. Since many of the multi-component dispensers are hand operated, highly viscous fluids cannot be blended by hand because of the back pressure developed during the circuitous route the resin blend must take in the two-paddle design. Also, when many blends are required, the length of the static mixer becomes cumbersome (up to twenty centimeters long, one-quarter of an inch or three eights of an inch in diameter). This causes a considerable amount of wasted material and also reduces work efficiency.

Thus, there is a need in the industry for a mixing element for a static mixer which can provide better blending of all types of fluids, including highly viscous fluids, so that the length of the static mixer becomes less cumbersome and less material is wasted.

SUMMARY OF THE INVENTION

The above-discussed and other drawbacks and deficiencies of the prior art are overcome or alleviated by the apparatus and method for making a multi-paddle mixing element for a static mixer of the present invention. In accordance with the present invention, an apparatus and method for making a multi-portion mixing element for a static mixer are disclosed. The apparatus includes a base and a split die set having a first die and a second die in axial alignment which are rotatably mounted to the base. Each of the dies have an opening forming an extrusion pattern which mate with respect to the other. The dies are capable of rotating together so that the patterns are in an aligned position during rotation. The dies are also capable of rotating to a misaligned position. An extruder for extruding an extrudable material through the first and second dies is provided and a controller controls the rotational position of the dies during extrusion. The dies are rotated simultaneously during extrusion with the patterns aligned to form a mixing portion of the mixing element and are rotated to a misaligned position to create a space between the mixing portions. The dies are then realized to form a new mixing portion rotationally displaced from the previous mixing portion. A microprocessor may be utilized to control the rotation of the first and second dies and to control the flow of the extrudable material.

The method of making the multi-portion static mixer includes providing the split die set, as described above, rotating the first and second dies so that said extrusion patterns arc aligned, extruding extrusion material through the first and second dies, rotating the first and second dies simultaneously during extrusion and rotating the first and second dies to a misaligned position to create a space along a shank between mixing portions, rotating the dies to a newly aligned position, and extruding extrusion material the first and second dies.

The method may also include varying the rate of extrusion during the rotation of the first and second dies to a misaligned position. Alternatively, the extruded material may be rotated as the dies are aligned in a stationary position with one of the dies rotating to a misaligned position to create a space along the shank between mixing portions.

The above-discussed and other drawbacks and deficiencies of the prior art are also overcome or alleviated by the static mixer and the mixing element for a static mixer of the present invention. The mixing element for a static mixer includes a shank and a plurality of mixing portions along the shank. The mixing portions are separated by a space, and each mixing portion has at least two extensions depending from the shank. The extensions vary in angular position along the shank and, in a preferred embodiment, are paddle shaped. Each mixing portion spirals or varies in angular position independently of the other mixing portions.

The static mixer includes a first container for containing one of the components to be mixed and a second container for containing the other component to be mixed. Each of the containers has an opening. A nozzle assembly is provided and has an inlet portion which communicates with the openings of the containers that directs the flow of the components into a mixing chamber. A mixing element is disposed in the mixing chamber and includes a plurality of mixing portions along a longitudinal axis thereof. The mixing portions are separated by a space, and each of the mixing portions includes a shank having at least two extensions depending therefrom. Each mixing portion spirals or varies in angular position independently of the other mixing portions. A discharging device is provided for discharging the components from the containers into a nozzle assembly where they are mixed as they pass through the mixing element. The mixing component is then discharged through the nozzle outlet.

The above description and other features and advantages of the present invention will be appreciated and understood by those skilled in the art from the following description.

BRIEF DESCRIPTION OF THE DRAWINGS

Referring now to the drawings wherein like elements are numbered alike in the several FIGURES.

DETAILED DESCRIPTION OF THE PREFERRED EMBODIMENT

Figure 1:
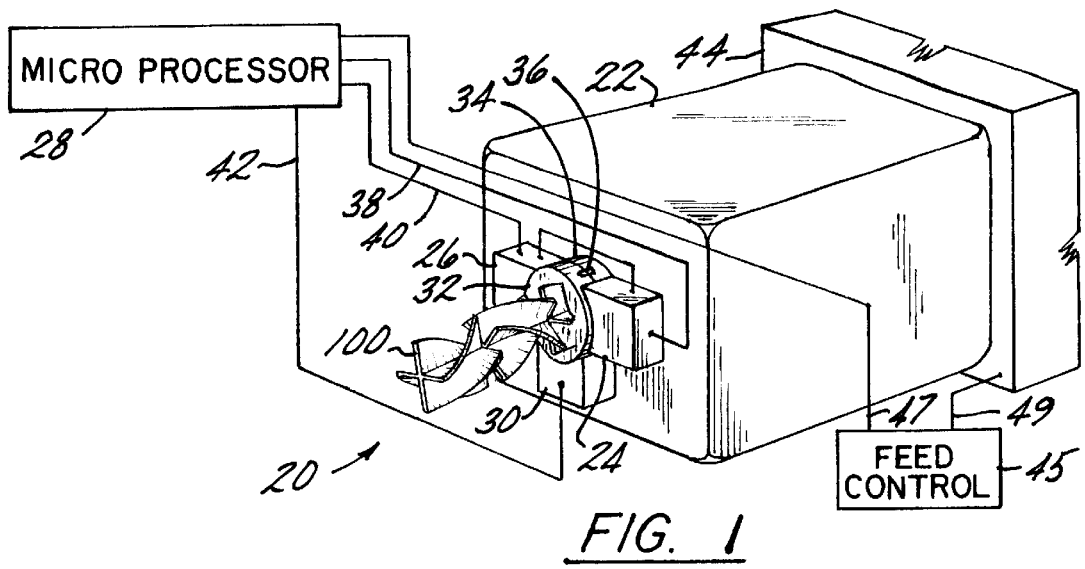
FIG. 1 is a perspective view of an apparatus for making a mixing element for a static mixer from an extrudable material in accordance with the present invention.
Figure 8:
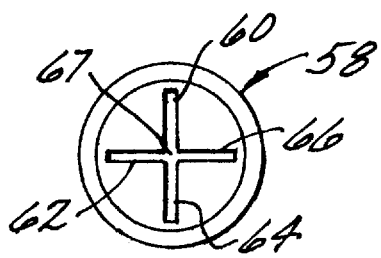
FIG. 8 is a front view of another extrusion pattern in accordance with the present invention.

Referring now to FIG. 1, an apparatus for making a mixing element for a static mixer from an extrudable material in accordance with a preferred embodiment of the invention is generally shown at 20. Apparatus 20 includes an extruding head 22 to which a split die set, 32 and 34, is rotatably mounted. The split die set 32 and 34 is axially aligned and receives extrusion material from extrusion head 22. Extruder 44 provides the extruding material as is well known in the art. As shown in FIG. 8, each die 32 and 34 includes an extrusion pattern, such as the extrusion pattern generally shown at 58. Dies 32 and 34 are capable of being rotated with the extrusion patterns aligned during extrusion so that mixing portions 110 of mixing element 100 vary in rotational position along the axis of mixing element 100. Dies 32 and 34 are also capable of rotating to a misaligned position to prevent extruding material except for the very center of the extrusion pattern from exiting the die set to cause a break in the mixing portions 110 of mixing element 100. Timing control 24 activates first and second motors 26 and 30 to rotate respective dies 32 and 34 and constitutes a controller for the apparatus 20. Alignment marks 36 are provided on the split die sets 32 and 34 to indicate an aligned position and misaligned position of the die sets 32 and 34. In a preferred embodiment, a microprocessor 28 is coupled via line 38 to timing control 24 and to motors 26 and 30 via respective lines 40 and 42. A feed control 45 is coupled via line 49 to extruder 44 and regulates the flow of the extruded material from extruder 44. As will be appreciated by those skilled in the art, as the rotational position of dies 32 and 34 enters into the misaligned position, the fluid forces vary significantly and feed control 45 regulates the flow of extrusion material to accommodate the reduction in need of extrusion material. Additionally, microprocessor 28 can be interfaced with feed control 45 via line 47. Microprocessor 28 allows an operator to easily adjust the manufacturing parameters of feed and rotation to produce a variety of mixing elements 100 as set forth in more detail below.

Figure 10:
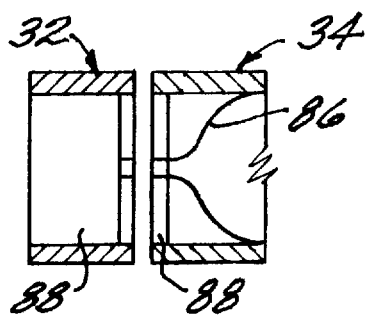
FIG. 10 is a cross-sectional view of the split die set in accordance with the present invention.

In operation, extruder 44 forces the extrudable material into extrusion head 22. Inward die 34, as shown in greater detail in FIG. 10, includes an inner restriction 86 which communicates with extrusion pattern portion 88 of die 34. Extrusion pattern portion 88 of die 34 is proportionally narrower than extrusion pattern portion 88 of outward die 32. As the extrudable material enters die 34 it is confined by restriction 86 and forced into extrusion pattern portion 88.

During extrusion, timing control 24 rotates dies 32 and 34 simultaneously while the mixing element 100 remains stationary as it is drawn out of the extruding head 22. The simultaneous rotation of dies 32 and 34 provides a spiral or angular variation in the extensions or paddles, as shown in FIGS. 2, 3, 4 and 5 (which depict a four paddle static mixer having paddles 102, 104, 106 and 108) at each mixing portion 110. Timing control 24 activates first and second drive motors 26 and 30. Drive motor 26 is coupled to die 32, and drive motor 30 is coupled to die 34. The connection of the motors to the dies is not critical and any conventional means of coupling motors 26 and 30 to dies 32 and 34 may be used (e.g., gear sets, pulleys, belts, cams, and the like). It will be appreciated to those skilled in the art that, alternatively, the mixing element 100 could be rotated as dies 32 and 34 remain stationary to provide an angular variation or spiraling effect for mixing portions 110 as mixing element 100 is extruded from extruding head 22. After the desired length of the mixing portion 110 of mixing element 100 has been extruded, timing control 24 activates drive motors 26 and 30 to rotate respective dies 32 and 34 to a misaligned position so that alignment marks 36 are misaligned. In the misaligned position, only the very center 67 of the respective extrusion patterns (as shown in FIG. 8) are aligned so that only the shank 109 is extruded. It will be appreciated by those skilled in the art that the amount of time during which extrusions dies 32 and 34 are misaligned determines the length of shank 109. Timing control 24, after a predetermined amount of time, activates motors 26 and 34 to rotate dies 32 and 34 back into an aligned position for continued extruding of another mixing portion 110. Extensions 102, 104, 106 and 108 of each mixing portion 110 can vary in angular position so that there is not a constant spiral along mixing portions 110. It will also be appreciated to those skilled in the art that one of the drive motors 26 and 30 may be eliminated if the mixing element is rotated during extrusion and the dies 32 and 34 remain aligned and stationary during extrusion.

Timing control 24, and optionally microprocessor 28, allow for variations in the degree of spiral for each mixing portion 110 as well as the length of mixing portion 110 and the space 112 between mixing portions 110. For example, for a two paddle mixer, the rotation from start to finish for a single spiral is 180°. For a four paddle mixer, the spiral from start to finish is rotated 90°. This is beneficial because the pressure drop or loss through the static mixer is reduced due to the fluid not having to travel as far before being subdivided each time. The pressure drop of the fluid being rotated through 90° per spiral will be less than the pressure loss of the fluid having to rotate 180° per spiral, as in the two-paddle mixer. However, the amount of rotation in the spiral can be different if the manufacturer so desires. For example, the four paddle mixture can be rotated 135° or 180° from start to finish of the spiral, if so required. This technique adds great flexibility to the manufacture of the static mixing element 100. The mixing element 100 as manufactured comprises a plurality of mixing portions 110 which can be wound on a large spool, adding to the convenience of handling. Microprocessor 28 allows quick changes in manufacturing parameters to vary the rate of rotation, alignment and feed.

Figure 6:
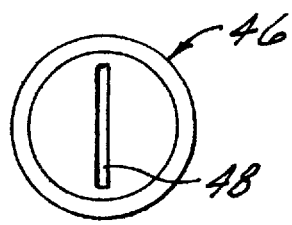
FIG. 6 is a front view of an extrusion pattern in accordance with the present invention.
Figure 7:
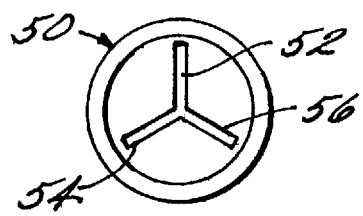
FIG. 7 is a front view of another embodiment of an extrusion pattern in accordance with the present invention.
Figure 9:
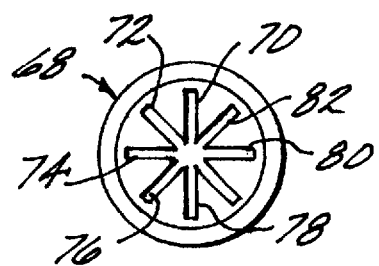
FIG. 9 is a front view of another extrusion pattern in accordance with the present invention.

Referring now simultaneously to FIGS. 6, 7, 8 and 9, a discussion of extrusion patterns for first and second die sets 32 and 34 follows. FIG. 6 depicts a double paddle extrusion pattern 46 having a single slot 48. It will be appreciated to those skilled in the art that a center portion of slot 48 produces shank 109 when respective dies 32 and 34 are misaligned. FIG. 7 depicts a three paddle extrusion pattern 50. Extrusion pattern 50 has three slots 52, 54 and 56 extending outward from a center of pattern 50. It will be appreciated to those skilled in the art that the angular variation between slots 52, 54 and 56 may be symmetrical or asymmetrical to vary mixing ratios. FIG. 8 depicts a four paddle mixer 58 having four slots 60, 62, 64 and 66 extending outward from a center 67 of pattern 58. As with the three paddle mixing extrusion pattern 50, the angular variation between paddles 60, 62, 64 and 66 may be symmetrically positioned from center 67 or asymmetrical. FIG. 9 depicts an eight paddle extrusion pattern 68 having eight slots 70, 72, 74, 76, 78, 80 and 82 extending from a center of extrusion pattern 68. In similar fashion, slots 70, 72, 74, 76, 78, 80 and 82 may be symmetrically positioned or asymmetrically positioned.

Figure 3:
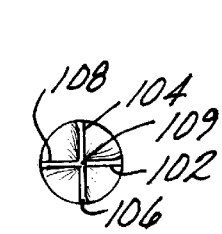
FIG. 3 is a cross-sectional view of the static mixer of FIG. 2 taken along line 3—3.
Figure 2:
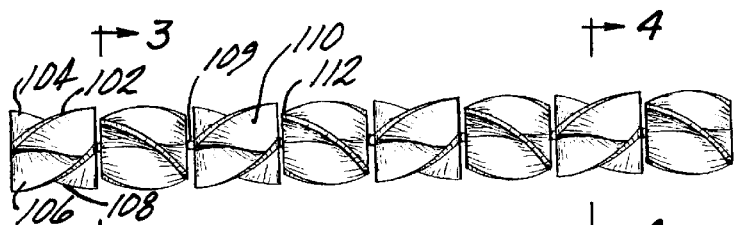
FIG. 2 is a side view of a static mixing element in accordance with the present invention.
Figure 4:
FIG. 4 is a cross-sectional view of the static mixer of FIG. 2 taken along line 4—4.
Figure 5:
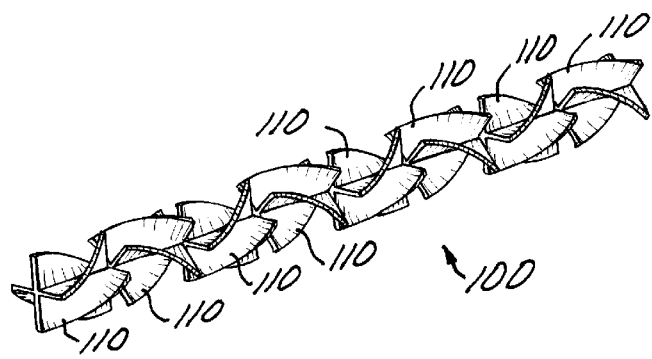
FIG. 5 is a perspective view of the static mixer of FIG. 2.

Referring now to FIG. 2, a discussion of the static mixing element 100 follows. Mixing element 100 has a plurality of mixing portions 110. Each mixing portion 110 spirals independently of the other mixing portions 110. Mixing portions have, in this embodiment, four extensions or paddles 102, 104, 106 and 108. Each mixing portion 110 is separated by a space 112. A shank 109 provides a central axis for mixing portions 110. As shown in FIGS. 3 and 4, the angular position of the paddles varies along the length of mixing portions 110. In this manner, the fluid is continually subdivided at each mixing portion for improved mixing.

Figure 11:
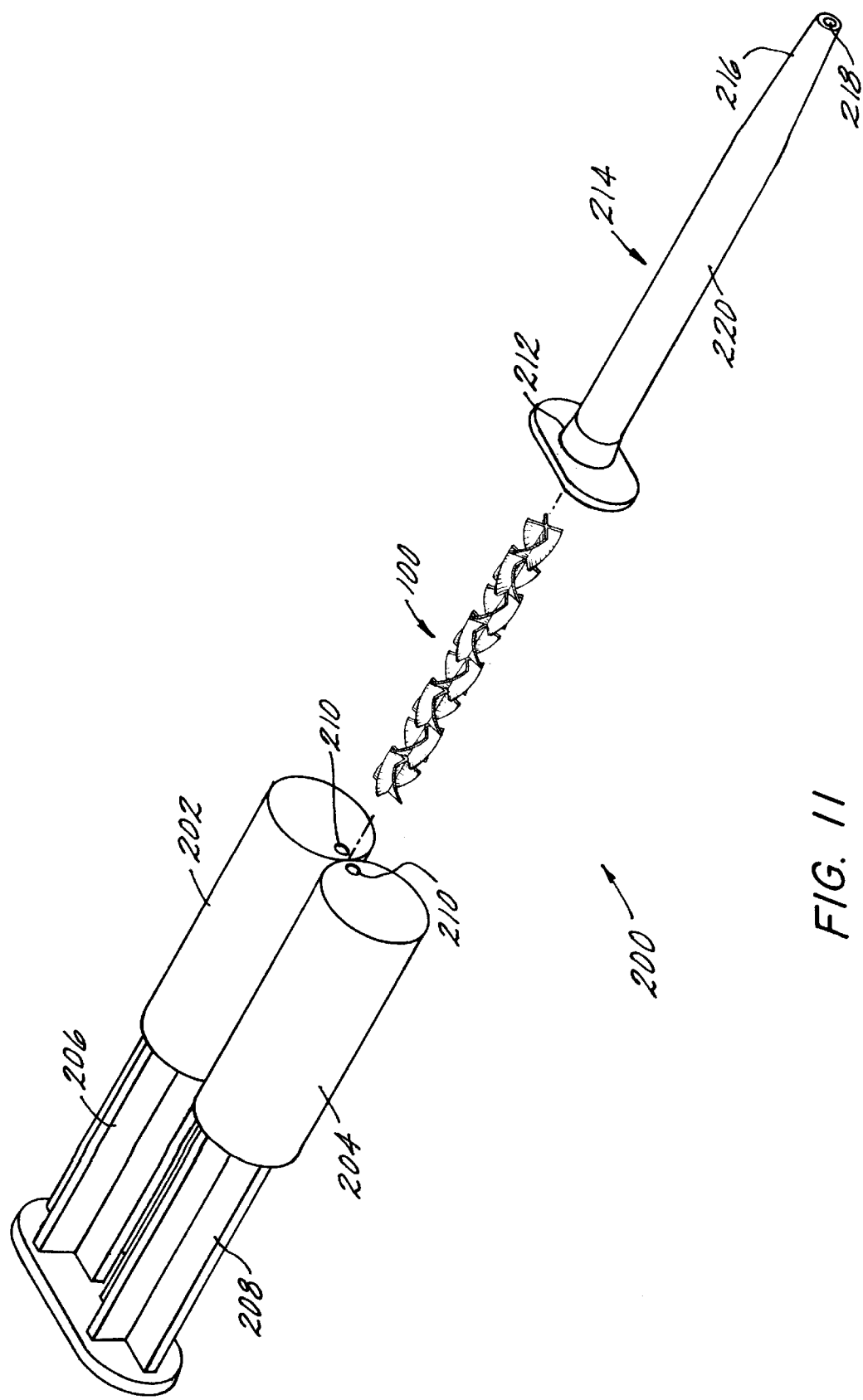
FIG. 11 is a perspective view of a static mixer in accordance with the present invention.

Referring now to FIG. 11, a static mixer is generally shown at 200. Static mixer 200 comprises two separate containers 202 and 204 for containing two fluid components to be mixed. Each container 202 and 204 has a respective opening 210 where the fluid components exit. Discharge elements 206 and 208 in the form of syringes force the fluid components out of respective openings 210. Static mixing device 200 further includes a nozzle assembly 214 having an inlet portion 212 and a discharge portion 216 having a discharge orifice 218. Mixing element 100 is positioned within mixing chamber 220 of nozzle assembly 214 and preferably positioned between respective openings 210. When assembled, inlet portion 212 is in fluid communication with openings 210 so that fluid components enter nozzle assembly 214 with mixing element 100 symmetrically positioned between openings 210. As fluid components are pushed through nozzle assembly 214, the components are spiraled and subdivided along mixer 100 and eventually discharged through orifice 218. As will be appreciated to those skilled in the art, such a static mixer using mixing element 100 can be in the form of a hand operated gun or automated mixing machine utilizing a mixing element 100 without departing from the spirit and scope of the present invention.

Thus, in use, an operator places two different fluid components to be next in respective containers 202 and 204. At the desired time for applying the mixture of the two fluid components, syringes 206 and 208 are depressed forcing fluids out of openings 210 and into inlet 212 where the fluids travel along mixing chamber 220 and through mixing element 100 for discharge through orifice 218 for application. After use, the nozzle assembly and mixing element can be discarded.

Although the figures shown relate to two part fluid mixing, it is understood that one skilled in the art would recognized that the present invention is advantageously adapted to providing for the mixing of a plurality of fluids.

For example, the three paddle mixer illustrated in FIG. 7 and the four paddle mixer illustrated in FIG. 8 are suitable for statically mixing three and four part fluid mixtures, respectfully, as described herein before for two part fluids.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An apparatus for making a mixing element for a static mixer from an extrudable material, comprising:

a base;

a split die set having a first die and a second die in axial alignment and rotatably mounted to said base, each of said dies having an opening forming an extrusion pattern, each said extrusion pattern mating with the other, said dies being cable of rotating together so that said patterns are in an aligned position during rotation, said dies being capable of rotating to a misaligned position;

an extruder for extruding the extrudable material through said first and second dies; and a controller for controlling the rotational position of said first and second dies, said dies being rotated simultaneously during extrusion with said patterns aligned to form a plurality of mixing portions of the mixing element, each of said mixing portions having at least two extensions, said dies being rotated to a misaligned position to create a space between said mixing portions.

2. An apparatus according to claim 1, wherein said pattern is a slot.

3. An apparatus according to claim 1, wherein said pattern is two slots positioned crosswise.

4. An apparatus according to claim 1, wherein said first die having a center in axial alignment with a center in said second die; and said pattern is three slots extending from the center of each respective said die.

5. An apparatus according to claim 1, wherein said extensions are paddle shaped.

6. An apparatus according to claim 3 wherein said slots are positioned symmetrically with respect to each other.

7. An apparatus according to claim 4 wherein said slots are positioned symmetrically with respect to each other.

8. An apparatus according to claim 5 wherein said slots are positioned symmetrically with respect to each other.

9. An apparatus according to claim 1, further comprising:

a microprocessor connected to said controller for regulating the rotational position of said first and second dies.

10. An apparatus according to claim 1, wherein:

said extruder includes a variable feed to regulate the flow of extrusion material.

11. An apparatus according to claim 10, further comprising:

a microprocessor connected to said controller and connected to said extruder for simultaneously regulating the rotational position of said first and second dies and the flow of extrusion material.

* * * * *